United States Patent
Shi

(10) Patent No.: US 11,936,401 B2
(45) Date of Patent: Mar. 19, 2024

(54) POLAR CODE DECODING METHOD AND APPARATUS, STORAGE MEDIUM, AND TERMINAL

(71) Applicant: ZTE CORPORATION, Guangdong (CN)

(72) Inventor: Guangming Shi, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/617,305

(22) PCT Filed: Jun. 11, 2020

(86) PCT No.: PCT/CN2020/095631
§ 371 (c)(1),
(2) Date: Dec. 7, 2021

(87) PCT Pub. No.: WO2020/259305
PCT Pub. Date: Dec. 30, 2020

(65) Prior Publication Data
US 2022/0311453 A1    Sep. 29, 2022

(30) Foreign Application Priority Data
Jun. 27, 2019   (CN) .......................... 201910568753.5

(51) Int. Cl.
*H03M 13/39* (2006.01)
*H03M 13/00* (2006.01)
*H03M 13/29* (2006.01)

(52) U.S. Cl.
CPC .... *H03M 13/3927* (2013.01); *H03M 13/2948* (2013.01); *H03M 13/611* (2013.01); *H03M 13/6561* (2013.01)

(58) Field of Classification Search
CPC ................................................. H03M 13/3927
See application file for complete search history.

(56) References Cited

U.S. PATENT DOCUMENTS

2009/0132887 A1*  5/2009  Matsumoto ........ H03M 13/1122
                                                              714/752
2017/0324514 A1  11/2017  Shen et al.
(Continued)

FOREIGN PATENT DOCUMENTS

CN         104038234 A        9/2014
CN         106788453 A        5/2017
(Continued)

OTHER PUBLICATIONS

Bin Li et al, "Parallel Decoders of Polar Codes", Sep. 4, 2013, 4 pgs., Retrieved from the Internet: URL:http://arxiv.org/ftp/arxiv/papers/1309/1309.1026.pdf.
(Continued)

*Primary Examiner* — Joseph D Torres
(74) *Attorney, Agent, or Firm* — Li & Cai Intellectual Property (USA) Office

(57) ABSTRACT

A Polar code decoding method and apparatus, a storage medium, and a terminal are provided. The method includes: dividing a Polar code having a length of N into S groups of Polar codes, each group of the S groups of Polar codes being data extracted from the Polar code having the length of N according to a preset rule, and S being an integer power of 2; and performing joint decoding on calculation results of the S groups of Polar codes after performing a logarithm likelihood ratio (LLR) calculation on each group of the S groups of Polar codes.

18 Claims, 3 Drawing Sheets

---

A Polar code having a length of N is divided into S groups of Polar codes. Herein, each group of the Polar codes are data extracted from the Polar code having the length of N according to a preset rule.    S110

Joint decoding is performed on calculation results of the S groups of Polar codes, after a logarithm likelihood ratio (LLR) calculation is performed on each group of the S groups of Polar codes.    S120

(56) References Cited

U.S. PATENT DOCUMENTS

2018/0376468 A1* 12/2018 Lin ...................... H04L 1/0057
2019/0149268 A1    5/2019 Xu et al.
2020/0212936 A1*  7/2020 Maunder .......... H03M 13/6508
2020/0358555 A1* 11/2020 Chen ................... H04L 1/0042

FOREIGN PATENT DOCUMENTS

| CN | 108649964 A | 10/2018 |
|---|---|---|
| CN | 109347600 A | 2/2019 |
| EP | 2953307 A1 | 12/2015 |
| JP | 2016515329 A | 5/2016 |
| WO | 2018171790 A1 | 9/2018 |
| WO | 2019042271 A1 | 3/2019 |
| WO | 2019062145 A1 | 4/2019 |

OTHER PUBLICATIONS

ZTE Corporation, Extended European Search Report, EP 20832402.0, dated May 30, 2022, 8pgs.
Sanechips Technology Co., Ltd., International Search Report, PCT/CN2020/095631, dated Sep. 15, 2020, 6 pgs.
Japan Patent Office, Office action dated Dec. 20, 2022, for corresponding JP application No. 2021-569504.

* cited by examiner

POLAR CODE DECODING METHOD AND APPARATUS, STORAGE MEDIUM, AND TERMINAL

CROSS REFERENCE TO RELATED APPLICATIONS

The present application is a United States National Stage Application filed under 35 U.S.C. § 371 of PCT Patent Application Serial No. PCT/CN2020/095631, filed Jun. 11, 2020, which claims priority to Chinese patent application No. 201910568753.5 filed before the China Intellectual Property Administration on Jun. 27, 2019, each of which is incorporated by reference herein in its entirety.

TECHNICAL FIELD

The embodiments of the present disclosure relate to the field of the $5^{th}$ generation mobile communication (5G) coding and decoding technology, and in particular to a Polar code decoding method and apparatus, a storage medium, and a terminal.

BACKGROUND

Technical criteria of the $5^{th}$ generation mobile communication (5G) technology are characterized by low time delay and high reliability. An application scenario of an Ultra Reliable Low Latency Communications (URLLC) of a 5G New Radio (NR) requires a user plane time delay to be 0.5 ms which is one twentieth of 10 ms, a user plane time delay required in the 4th generation mobile communication (4G). A 5G NR enhanced mobile broadband (eMBB) application scenario requires the user plane time delay to be 4 ms which is two fifth of the user plane time delay required in 4G. Theoretically, Polar code coding and decoding may be applied to prove that a Shannon limit may be achieved when a code is sufficiently long, which meets the requirement of high reliability in 5G. However, low time delay is challenging in Polar code design.

In a related art, a successive cancellation (SC) decoding algorithm is applied on the Polar code decoding, a decoding process of which is bit successive decoding, leading to too long time delay in decoding. Based on the SC algorithm, improved enhanced SC decoding algorithms include: successive cancellation list decoding (SCL), successive cancellation stack decoding (SCS), successive cancellation hybrid decoding (SCH) and the like. The enhanced SC decoding algorithms may reduce a decoding time delay to some extent, but these enhanced SC decoding algorithms substantively are successive decoding algorithms which do not meet the requirement of low time delay in 5G.

SUMMARY

Embodiments of the present disclosure provide a Polar code decoding method and apparatus, a storage medium, and a terminal. In this way, the problem of high time delay of Polar code decoding existing in a related art is addressed.

Some embodiments of the present disclosure provide a Polar code decoding method, including:
dividing a Polar code having a length of N into S groups of Polar codes, each group of the Polar codes being data extracted from the Polar code having the length of N according to a preset rule, and S being an integer power of 2; and
performing joint decoding on a calculation result of each group of the Polar codes, after performing logarithm likelihood ratio (LLR) calculation on each group of the S groups of the Polar codes.

Some embodiments of the present disclosure provide a Polar code decoding system, including:
a control module configured to divide a Polar code having a length of N into S groups of Polar codes, each group of the Polar codes being data extracted from the Polar code having the length of N according to a preset rule, each group of the Polar codes being distributed to S calculation modules in sequence, and S being an integer power of 2;
each of the S calculation modules configured to perform logarithm likelihood ratio (LLR) calculation on each group of the Polar codes received; and
a decoding module configured to perform joint decoding on an LLR calculation result obtained by each of the S calculation modules.

Some embodiments of the present disclosure provide a computer readable storage medium storing a computer executable instruction that, when executed by a processor, implements the Polar code decoding method according to the above embodiments.

Some embodiments of the present disclosure provide a Polar code decoding terminal, including:
a memory configured to store a computer executable instruction;
a processor, configured to execute the computer executable instruction to implement the Polar code decoding method according to the above embodiments.

BRIEF DESCRIPTION OF THE DRAWINGS

The drawings are provided to facilitate understanding the technical solutions of the present disclosure and form a part of the specification. The drawings and the embodiments of the present disclosure in combination are provided to facilitate describing the technical solutions of the present disclosure but do not constitute limitation to the technical solutions of the present disclosure.

DETAILED DESCRIPTION

Figure 1:
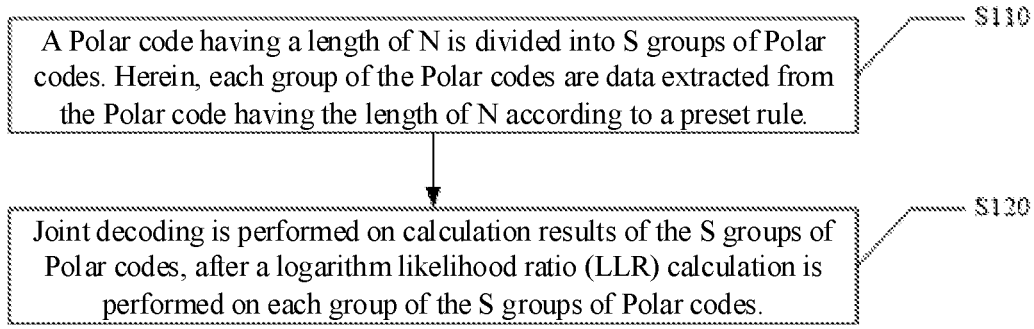
FIG. 1 is a flow chart of a Polar code decoding method provided in an embodiment of the present disclosure.

The embodiments of the present disclosure will be described with reference to the drawings.

The steps shown in the flow charts of the drawings may be implemented in a computer system including a group of computer executable instructions.

A length N of a Polar code refers to a number of bits of the Polar code to be decoded. During a Polar code decoding process, log-likelihood ratio (LLR) calculation on a left-child node (i.e., an f node) on a decoding tree and the LLR calculation on a right-child node (i.e., a g node) on the decoding tree shall be performed. It is supposed that $A_0[i]$ is an LLR data initially input, i.e., the $0^{th}$ layer of node on the decoding tree. To perform the LLR calculation on the f node, i.e., to update LLR($A_{lm}$) of the left-child node of the $m^{th}$ layer node i on the decoding tree, a formula is:

$$A_{lm}[i] = \text{sign}(A_{(m-1)}[i])\text{sign}\left(A_{(m-1)}\left[i+\frac{N}{2}\right]\right) \times \min\left(|A_{(m-1)}[i]|, \left|A_{(m-1)}\left[i+\frac{N}{2}\right]\right|\right)$$

$$i = 1, 2, \ldots \frac{N}{2}$$

Sign ( ) is a signum function, m is a height of the decoding tree. In the formula, m is valued within a range of $1 \sim \log_2(N)$.

The LLR calculation is performed on the g node, i.e., LLR($A_{lm}$) of the right-child node of the $m^{th}$ layer node i on the decoding tree is updated. The value shall be updated with a hard decision value $B_{lm}$ fed back by the left-child node. The hard decision value $B_{lm}$ is decoding information determined according to a decoding path, and a calculation formulas may be:

$$A_{rm}[i] = A_{(m-1)}\left[i+\frac{N}{2}\right] + (-1)^{B_{lm}(i)}A_{(m-1)}[i]$$

$$i = 1, 2 \ldots \frac{N}{2}$$

It is known from the LLR calculation formula for the f node that the LLR calculation of the $m^{th}$ layer node i is only related to a fixed LLR data of the $(m-1)^{th}$ layer. It is known from the LLR calculation formula for the g node that the LLR calculation of the $m^{th}$ layer node i is only related to a fixed LLR data of the $(m-1)$th layer and the hard decision value $B_{lm}$, fed back by the left-child node. Data required for the LLR calculation on each node are independent from each other. Therefore, f node and g node calculations on s paths may be performed in parallel. Herein, s is an integer power of 2, and values for s are not limited to 1, 2, 4, 8, 16 and 32. The greater the value of s is, the shorter a decoding time delay is. A person having ordinary skill in the art may determine a value for s according to an actual requirement for the decoding time delay. Formulas for calculations on s paths are:

$$A_{lm}[i] = \text{sign}(A_{(m-1)}[i])\text{sign}\left(A_{(m-1)}\left[i+\frac{N}{2}\right]\right) \times \min\left(|A_{(m-1)}[i]|, \left|A_{(m-1)}\left[i+\frac{N}{2}\right]\right|\right)$$

$$A_{lm}[i+1] = \text{sign}(A_{(m-1)}[i+1])\text{sign}\left(A_{(m-1)}\left[i+1+\frac{N}{2}\right]\right) \times \min\left(|A_{(m-1)}[i+1]|, \left|A_{(m-1)}\left[i+1+\frac{N}{2}\right]\right|\right)$$

$$\ldots$$

$$A_{lm}[i+s-1] = \text{sign}(A_{x(m-1)}[i+s-1])\text{sign}\left(A_{(m-1)}\left[i+s-1+\frac{N}{2}\right]\right) \times \min\left(|A_{(m-1)}[i+s-1]|, \left|A_{(m-1)}\left[i+s-1+\frac{N}{2}\right]\right|\right)$$

$$i = 1, 2 \ldots \frac{N}{2}$$

$$A_{rm}[i] = A_{(m-1)}\left[i+\frac{N}{2}\right] + (-1)^{B_{lm}(i)}A_{(m-1)}[i]$$

$$A_{rm}[i+1] = A_{(m-1)}\left[i+1+\frac{N}{2}\right] + (-1)^{B_{lm}(i+1)}A_{(m-1)}[i+1]$$

$$\ldots$$

$$A_{rm}[i+s-1] = A_{(m-1)}\left[i+s-1+\frac{N}{2}\right] + (-1)^{B_{lm}(i+s)}A_{(m-1)}[i+s-1]$$

$$i = 1, 2 \ldots \frac{N}{2}$$

According to the above deduction, embodiments of the present disclosure provide a Polar code decoding method and apparatus, a storage medium, and a terminal.

As shown in FIG. 1, an embodiment of the present disclosure provides a Polar code decoding method, the method includes as follows.

In step S110, a Polar code having a length of N is divided into S groups of Polar codes. Herein, each group of the Polar codes are data extracted from the Polar code having the length of N according to a preset rule.

S is an integer power of 2.

In step S120, joint decoding is performed on calculation results of the S groups of Polar codes, after a logarithm likelihood ratio (LLR) calculation is performed on each group of the S groups of Polar codes.

In the present disclosure, long blocks of the Polar code are grouped. Since groups are not coupled to each other, each grouped data is decoded and then the decoding results of the groups are jointly decoded. In this way, a decoding time delay is reduced as compared with decoding a Polar code of an entire long block in a related art. Therefore, the problem of long time delay of Polar code decoding in the related art is removed.

In this embodiment, the step of dividing the Polar code having the length of N into the S groups of Polar codes, each group of the Polar codes being data extracted from the Polar code having the length of N according to the preset rule, includes as follows. The Polar code having the length of N is divided into S groups of Polar codes. Herein, a starting point of each group of the Polar codes is one of S successive Polar codes selected from the Polar code having the length of N, data except the starting point of each group of the Polar codes are data obtained via extraction from the Polar code having the length of N with S being a unit step length, and a length of each group of the Polar codes is N/S. For example, when S is 2, two groups of the Polar codes are $A_0[2i]$ and $A_0[2i-1]$, respectively, i=1, 2 . . . N/2, and a length of each group of the Polar codes is N/2. Alternatively, when S is 4, four groups of the Polar codes are $A_0[4i]$, $A_0[4i-1]$, $A_0[4i-2]$ and $A_0[4i-3]$, respectively, i=1, 2 . . . N/4, and a length of each group of the Polar codes is N/4.

In this embodiment, after dividing the Polar code having the length of N into the S groups of Polar codes, each group of the Polar codes being data extracted from the Polar code having the length of N according to the preset rule, the method further includes as follows. Each group of the Polar codes is divided into M groups of Polar codes. Herein, M is an integer power of 2. Performing the LLR calculation on each group of the S groups of Polar codes includes: after performing the LLR calculation on each group of the M groups of Polar codes, the LLR calculation is performed on M LLR calculation results obtained, and the LLR calculation results of the M groups of Polar codes obtained are taken as an LLR result of a respective group of the S groups of Polar codes.

The step of dividing each group of the Polar codes into the M groups of Polar codes includes as follows. Each group of the Polar codes having the length of N/S are divided into the M groups of Polar codes. Herein, a starting point of each group of the M groups of Polar codes is one of M successive Polar codes selected from each group of the Polar codes having the length of N/S. Data except the starting point of each group of the M groups of Polar codes are data obtained via extraction from each group of the Polar codes having the length of N/S with M being a unit step length. A length of each group of the Polar codes among the divided M groups of Polar codes is N/(S*M). For example, a Polar code having a length of 2048 is divided into four groups of polar codes. A first group of the Polar codes are $\{A_0[8i], A_0[8i-4]\}$, a second group of the Polar codes are $\{A_0[8i-1], A_0[8i-5]\}$, a third group of the Polar codes are $\{A_0[8i-2], A_0[8i-6]\}$ and a fourth group of the Polar codes are $\{A_0[8i-3], A_0[8i-7]\}$, i=1, 2, . . . , 256. Then each group of the Polar codes are divided into two groups of Polar codes. The first group of the Polar codes are divided into $\{A_0[8i]\}$ and $\{A_0[8i-4]\}$. The second group of the Polar codes are divided into $\{A_0[8i-1]\}$ and $\{A_0[8i-5]\}$. The third group of the Polar codes are divided into $\{A_0[8i-2]\}$ and $\{A_0[8i-6]\}$. The fourth group of the Polar codes are divided into $\{A_0[8i-3]\}$ and $\{A_0[8i-7]\}$. Herein, the first group of the Polar codes are taken as an example. The LLR calculation on $A_0[8i]$ is completed and one calculation result is cached and output. The LLR calculation on $A_0[8i-4]$ is completed and one calculation result is cached and output. The LLR calculation is performed on the two calculation results cached to output one calculation result as a final result for the LLR calculation on the first group of the Polar codes. The LLR calculation on the other three groups of the Polar codes involve similar procedures as the LLR calculation on the first group of the Polar codes and are not described in detail herein to avoid repetition.

In this embodiment, performing the LLR calculation on each group of the Polar codes includes: performing, in parallel, the LLR calculation on each group of the Polar codes.

In a related art, bit successive decoding is performed on Polar codes. By comparison, parallel decoding is applied in this embodiment, which may reduce a decoding time delay.

In the following description, examples are provided to describe the embodiment of the present disclosure.

Example 1

It is supposed that block lengths of Polar codes to be decoded are 1024, 256, 256, 256, 256, 1024, 256, 256, 256, 256, 256, respectively. A decoding process is as follows.

In step 1, an LLR calculation unit is configured to perform the LLR calculation on the Polar codes. Four LLR calculation units are configured in this example. Each LLR calculation unit may perform calculation on a code block having a length of 256. LLR data of Polar code blocks to be decoded are respectively written into a memory and a writing address with which the data is written into is recorded. A decoding parameter is configured to include a writing address of LLR data of each code block, a code length of each code block and decoding accompanying parameters. The decoding accompanying parameters include: a frozen bit, an information bit, a check bit indicator, a number of information bits, a cyclic redundancy check (CRC) pattern, etc.

In step 2, decoding is started and decoding parameters configured as the above are read.

Figure 2:
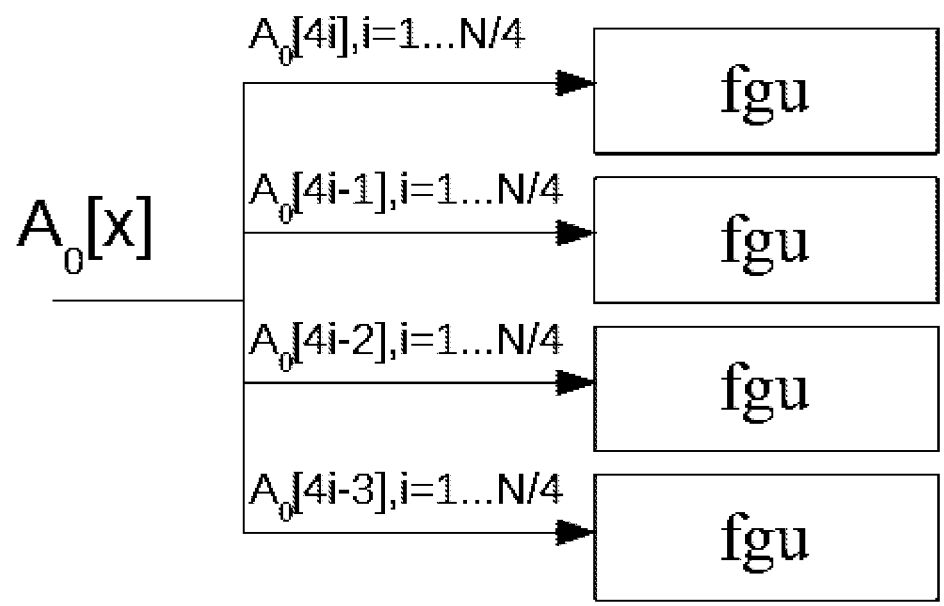
FIG. 2 is a schematic diagram of calculating single code blocks in parallel according to an example of the present disclosure.

In step 3, one Polar code having a length of 1024 is decoded and it is inquired whether four LLR calculation units are all available. In a case where all the four LLR calculation units are available, the Polar code having a length of 1024 are divided into four groups and respectively transmitted to four LLR calculation units to perform the LLR calculation. As shown in FIG. 2, an fgu unit in FIG. 2 is an LLR calculation unit, and the four groups of Polar codes respectively are $A_0[4i], A_0[4i-1], A_0[4i-2], A_0[4i-3]$, i=1, 2, . . . , 256. One calculation result is output after the LLR calculation on each group of the four groups of the Polar codes. One calculation result is taken from each LLR calculation unit each time to form four LLR data sequences. Path expansion is completed with accompanying information such as the frozen bit, the information bit, the check bit and the like. According to an output path metric value, a decoding decision is made, current 4 bits decoding data are output, and the decoding tree is updated until decoding of all data is completed.

Figure 3:
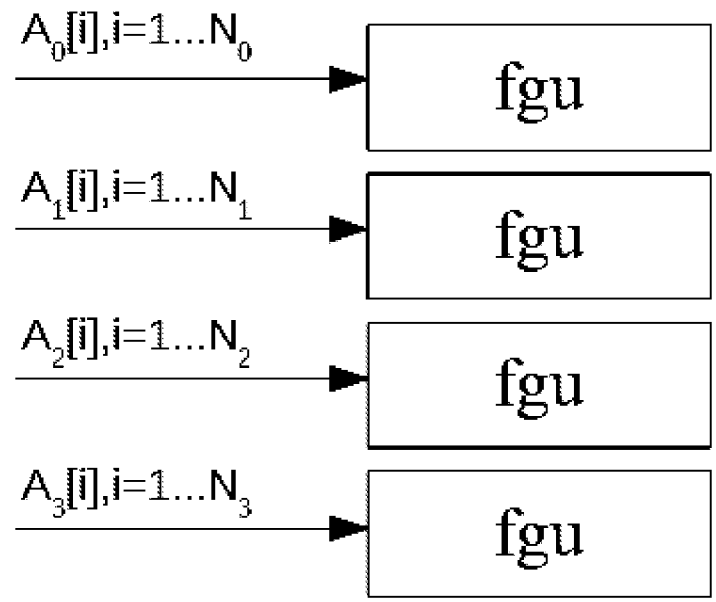
FIG. 3 is a schematic diagram of calculating four code blocks in parallel according to an example of the present disclosure.

In step 4, four Polar codes each having the length of 256 are decoded. As shown in FIG. 3, the four 256-code blocks are respectively transmitted to four LLR calculation units which run in parallel and output four calculation results. For the Polar code having the length of 256, decoding time delays may vary and decoding of the four Polar code blocks may end at different times, because each Polar code block has a different number of frozen bits. When it is known that a next code block has a length of 1024, decoding of the code block having the length of 1024 is not started until the LLR calculation on all the code blocks having the length 256 is completed.

In step 5, one Polar code having a length of 1024 is decoded. Similar to step 3, the Polar code having a length of 1024 are divided into four groups and transmitted to four LLR calculation units for the LLR calculation. One calculation result is acquired from one LLR calculation unit each time to form four LLR data sequences to complete path expansion according to accompanying information such as the frozen bit, the information bit, the check bit and the like. According to an output path metric value, a decoding decision is made, current 4 bits decoding data are output, and the decoding tree is updated until decoding of all data is completed.

In step 6, five Polar codes each having the length of 256 are decoded and it is inquired whether one LLR calculation unit is available. In a case where one LLR calculation unit is available, the Polar codes are transmitted to the LLR calculation unit for calculation. In a case where there is no LLR calculation unit available, there will be wait until one LLR calculation unit is available. As long as one LLR calculation unit completes calculation, all calculation results of the LLR calculation unit are acquired, path expansion is completed according to accompanying information such as the frozen bit, the information bit, the check bit and the like to output a path metric value. Decoding decision is made according to the output path metric value to update the decoding tree.

Example 2

It is supposed that a block length of current Polar code to be decoded is 2048. A decoding process is as follows.

In step 1, an LLR calculation unit is configured to perform the LLR calculation on the Polar code. Eight LLR calculation units are configured in this example. Four of the LLR calculation units may perform calculation on a code block having a length of 256, and the other four of the LLR calculation units may perform calculation on a code block having a length of 2. LLR data of Polar code blocks to be decoded are respectively written into a memory and a writing address is recorded. A decoding parameter is configured to include a writing address of LLR data of each code block, a code length of each code block and decoding accompanying parameters.

In step 2, decoding is started, and decoding accompanying parameters as stated above are read.

In step 3, it is inquired in real time whether four LLR calculation units each having a length of 256 are available. In a case where the four LLR calculation units each having the length of 256 are available, data transmitted to each LLR calculation unit having the length of 256 respectively are $\{A_0[8i], A_0[8i-4]\}$, $\{A_0[8i-1], A_0[8i-5]\}$, $\{A_0[8i-2], A_0[8i-6]\}$, $\{A_0[8i-3], A_0[8i-7]\}$, i=1, 2, . . . , 256. In a case where not all the four LLR calculation units each having the length of 256 are available, there will be wait until all LLR calculation units each having the length of 256 are available.

Figure 4:
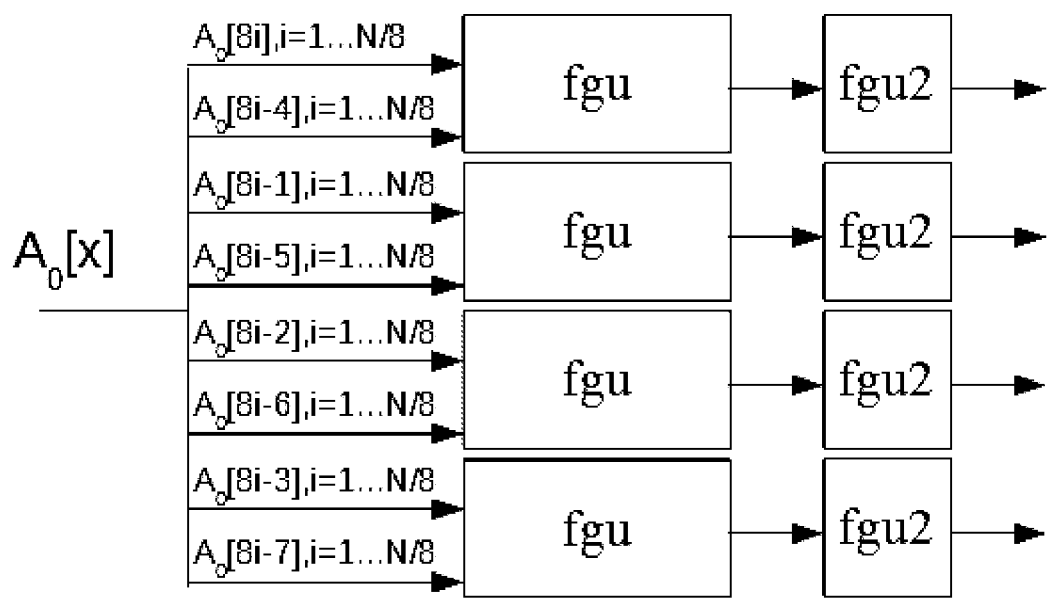
FIG. 4 is a schematic diagram of calculating long blocks in parallel according to an example of the present disclosure.

One of the four LLR calculation units each having the length of 256 is taken as an example. It is supposed that data received by the LLR calculation unit are $\{A_0[8i], A_0[8i-4]\}$. Primarily, LLR data calculation on $A_0[8i]$ is completed, i=1, 2, . . . , 256, and one calculation result is cached and output. Then, LLR data calculation on $A_0[8i-4]$ is completed, i=1, 2, . . . , 256, and one calculation result is cached and output. Then two cached calculation results are input into the calculation unit having the length of 2 to output one final calculation result. The other three LLR calculation units each having the length of 256 involve the same calculation processes as such and the processes are not repeated, as shown in FIG. 4.

In step 4, one calculation result is acquired from each LLR calculation unit with the length of 2 each time to form four LLR data sequences. Path expansion is completed according to accompanying information such as the frozen bit, the information bit, the check bit and the like to output a path metric value. Decoding decision is made according to a path metric value to output current 4 bits data obtained and to update the decoding tree until decoding on all data is completed.

To decode Polar code having the length of 2048, the LLR calculation unit having the length of 2 may directly re-use a logic in an LLR calculation unit having the length of 256 rather than to set a new LLR calculation unit.

Figure 5:
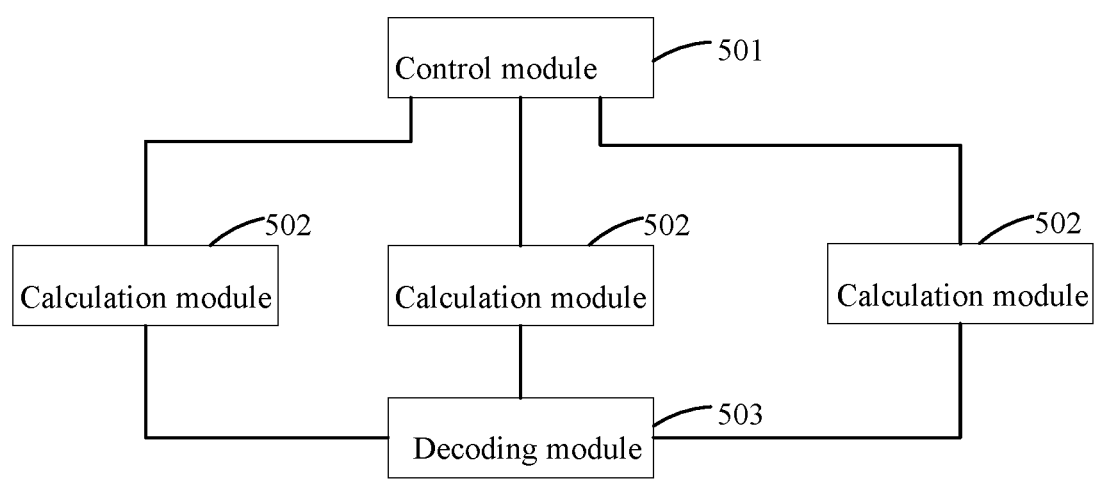
FIG. 5 is a block diagram of composition of a Polar code decoding system provided in an embodiment of the present disclosure.

The present disclosure further provides a Polar code decoding system. As shown in FIG. 5, the system includes: a control module 501 configured to divide a Polar code with a length of N into S groups of Polar codes, each group of the Polar codes being data extracted from the Polar code having the length of N according to a preset rule, each group of the Polar codes being distributed to S calculation modules in sequence, and S being an integer power of 2; each of the S calculation modules 502 configured to perform LLR calculation on each group of the Polar codes received; and a decoding module 503 configured to perform joint decoding on an LLR calculation result obtained by each calculation module.

In the present disclosure, long block of the Polar code is grouped. Since groups are not coupled to each other, each grouped data is decoded and then the decoding results of the groups are jointly decoded. In this way, a decoding time delay is reduced as compared with decoding a Polar code of an entire long block in a related art.

In one implementation, the control module 501 is configured to divide the Polar code having the length of N into the S groups of the Polar codes (herein, each group of the Polar codes are data extracted from the Polar code having the length of N according to the preset rule) in the following manner. The Polar code having the length of N is divided into S groups of Polar codes. A starting point of each group of the Polar codes is one of S successive Polar codes selected from the Polar code having the length of N. Data except the starting point of each group of the Polar codes are data obtained via extraction from the Polar code having the length of N with S being a unit step length. A length of each group of the Polar codes is N/S. For example, when S is 2, two groups of the Polar codes respectively are $A_0[2i]$ and $A_0[2i-1]$, i=1, 2 . . . N/2, and a length of each group of the Polar codes is N/2. When S is 4, four groups of the Polar codes respectively are 4[4i], $A_0[4i-1]$, $A_0[4i-2]$ and $A_0[4i-3]$, i=1, 2, . . . , N/4, and a length of each group of the Polar codes is N/4.

In one implementation, the control module 503 is further configured to divide each group of the S groups of Polar codes into M groups, M being an integer power of 2, and to distribute each group of the M groups of Polar codes to the calculation module. The calculation module 502 is configured to, after performing the LLR calculation on each group of the M groups of Polar codes, perform the LLR calculation on M LLR calculation results obtained, and take the LLR results of the M groups of Polar codes obtained as an LLR calculation result of a respective group of the S groups of Polar codes received.

In one implementation, the control module 503 is configured to divide each group of the S groups of Polar codes into the M groups of Polar codes by dividing each group of the Polar codes having the length of N/S into the M groups of Polar codes. Herein, a starting point of each group of the M groups of Polar codes is one of M successive Polar codes selected from each group of the Polar codes having the length of N/S. Data except the starting point of each group of the M groups of Polar codes are data obtained via extraction from each group of the Polar codes having the length of N/S with M being a unit step length. A length of each group of the Polar codes among the divided M groups of Polar codes is N/(S*M). For example, a Polar code having a length of 2048 is divided into four groups of polar codes. A first group of the Polar codes are $\{A_0[8i], A_0[8i-4]\}$, a second group of the Polar codes are $\{A_0[8i-1], A_0[8i-5]\}$, a third group of the Polar codes are $\{A_0[8i-2], A_0[8i-6]\}$ and a fourth group of the Polar codes are $\{A_0[8i-3], A_0[8i-7]\}$, i=1, 2, . . . , 256. Then each group of the Polar codes are divided into two groups of Polar codes. The first group of the Polar codes are divided into $\{A_0[8i]\}$ and $\{A_0[8i-4]\}$. The second group of the Polar codes are divided into $\{A_0[8i-1]\}$ and $\{A_0[8i-5]\}$. The third group of the Polar codes are divided into $\{A_0[8i-2]\}$ and $\{A_0[8i-6]\}$. The fourth group of the Polar codes are divided into $\{A_0[8i-3]\}$ and $\{A_0[8i-7]\}$. Herein, the first group of the Polar codes are taken as an example. The LLR calculation on $A_0[8i]$ is completed and one calculation result is cached and output. The LLR calculation on $A_0[8i-4]$ is completed and one calculation result is cached and output. The LLR calculation on the two calculation results to output one calculation result as a final result for the LLR calculation on the first group of the Polar codes. The LLR calculation on the other three groups of the Polar codes involve similar procedures as the LLR calculation on the first group of the Polar codes and are not described in detail herein to avoid repetition.

In one implementation, the calculation module 502 is configured to perform the LLR calculation on each group of the Polar codes in the following manner performing, in parallel, the LLR calculation on each group of the Polar codes.

In this embodiment, compared with a related art, bit successive decoding is performed on Polar codes and a parallel decoding manner is used. In this way, decoding time delay is reduced.

An embodiment of the present disclosure further provides a computer readable storage medium storing a computer executable instruction that, when executed by a processor, implements the Polar code decoding method according to the above embodiments.

An embodiment of the present disclosure further provides a Polar code decoding terminal, including:

a memory configured to store a computer executable instruction;

a processor configured to execute the computer executable instruction to implement steps of the Polar code decoding method according to the above embodiments.

A person having ordinary skill in the art can understand that all or some functional modules/units in some or all steps, systems and apparatuses described in the above disclosed methods can be implemented as software, firmware, hardware, and appropriate combinations thereof. In a hardware implementation, division between functional modules/units mentioned in the above description does not necessarily correspond to division of physical components. For example, one physical component may have multiple functions, or one function or step may be implemented through cooperation of multiple physical components. Some or all of the components may be implemented as software executed by a processor, such as a digital signal processor or a microprocessor, or as hardware, or as an integrated circuit such as an application specific integrated circuit. Such software may be distributed on a computer readable medium which may include a computer storage medium (or a non-transitory medium) and a communication medium (or a transitory medium). As is well known to a person having ordinary skill in the art, the term computer storage medium includes volatile and non-volatile, removable and non-removable medium implemented in any method or technology for storing information (such as a computer readable instruction, a data structure, a program module, or any other data). The computer storage media includes but not limited to a random access memory (RAM), a read-only memory (ROM), an electrically erasable programmable read-only memory (EEPROM), a flash memory or any other storage technology, a compact disk read only memory (CD-ROM), a digital versatile disk (DVD) or any other optical disk storage, a magnetic cartridge, a magnetic tape, a disk storage or any other magnetic storage device, or any other medium that can be used to store desired information and can be accessed by a computer. In addition, as is well known to a person having ordinary skill in the art, a communication medium usually includes computer-readable instructions, data structures, program modules, or other data in a modulated data signal such as carrier waves or other transmission mechanisms, and may include any information delivery medium.

What is claimed is:

1. A Polar code decoding method applied to a Polar code decoding terminal, the Polar code decoding terminal comprising a memory configured to store computer executable instructions and a processor configured to execute the computer executable instructions to implement the method, the method comprising:

receiving a signal comprising a Polar code;

dividing the Polar code having a length of N into mutually exclusive S groups of Polar codes, each group of the S groups of Polar codes being data extracted from the Polar code having the length of N, S being an integer power of 2; and performing joint decoding on calculation results of the S groups of Polar codes, after performing a logarithm likelihood ratio (LLR) calculation on each group of the S groups of Polar codes.

2. The Polar code decoding method according to claim 1, wherein dividing the Polar code having the length of N into the mutually exclusive S groups of Polar codes, each group of the S groups of Polar codes being data extracted from the Polar code having the length of N, comprises:

dividing the Polar code having the length of N into the mutually exclusive S groups of Polar codes, wherein a starting point of each group of the S groups of Polar codes is one of S successive Polar codes selected from the Polar code having the length of N, data except the starting point of each group of the S groups of Polar codes are data obtained via extraction from the Polar code having the length of N with S being a unit step length, and a length of each group of the S groups of Polar codes is N/S.

3. The Polar code decoding method according to claim 2, wherein after dividing the Polar code having the length of N into the mutually exclusive S groups of Polar codes, each group of the S groups of Polar codes being data extracted from the Polar code having the length of N, the method further comprises:

dividing each group of the S groups of Polar codes into M groups of Polar codes, wherein M is an integer power of 2; and performing the LLR calculation on each group of the S groups of Polar codes comprises: after performing an LLR calculation on each group of the M groups of Polar codes, performing an LLR calculation on M LLR results obtained, and taking an LLR result of the M groups of Polar codes obtained as an LLR result of a respective group of the S groups of Polar codes.

4. The Polar code decoding method according to claim 3, wherein dividing each group of the S groups of Polar codes into the M groups of Polar codes comprises:

dividing each group of the S groups of Polar codes having a length of N/S into the M groups of Polar codes, wherein a starting point of each group of the M groups of Polar codes is one of M successive Polar codes selected from each group of the S groups of Polar codes having the length of N/S, data except the starting point of each group of the M groups of Polar codes are data obtained via extraction from each group of the S groups of Polar codes having the length of N/S with M being a unit step length, and a length of each group of the M groups of Polar codes is N/(S*M).

5. The Polar code decoding method according to claim 3, wherein performing the LLR calculation on each group of the M groups of Polar codes comprises:

performing, in parallel, the LLR calculation on each group of the M groups of Polar codes.

6. The Polar code decoding method according to claim 2, wherein performing the LLR calculation on each group of the S groups of Polar codes comprises:

performing, in parallel, the LLR calculation on each group of the S groups of Polar codes.

7. A non-transitory computer readable storage medium, storing a computer executable instruction that, when executed by a processor, implements a Polar code decoding method applied to a Polar code decoding terminal; the method comprising:

receiving a signal comprising a Polar code;

dividing the Polar code having a length of N into mutually exclusive S groups of Polar codes, each group of the S groups of Polar codes being data extracted from the Polar code having the length of N, S being an integer power of 2; and performing joint decoding on calculation results of the S groups of Polar codes, after performing a logarithm likelihood ratio (LLR) calculation on each group of the S groups of Polar codes.

8. A Polar code decoding terminal, comprising:

a memory, configured to store a computer executable instruction;

a processor, configured to execute the computer executable instruction to implement a Polar code decoding method; the method comprising:

receiving a signal comprising a Polar code;

dividing the Polar code having a length of N into mutually exclusive S groups of Polar codes, each group of the S groups of Polar codes being data extracted from the Polar code having the length of N, S being an integer power of 2; and performing joint decoding on calculation results of the S groups of Polar codes, after performing a logarithm likelihood ratio (LLR) calculation on each group of the S groups of Polar codes.

9. The terminal according to claim 8, wherein dividing the Polar code having the length of N into the mutually exclusive S groups of Polar codes, each group of the S groups of Polar codes being data extracted from the Polar code having the length of N, comprises:

dividing the Polar code having the length of N into the mutually exclusive S groups of Polar codes, wherein a starting point of each group of the S groups of Polar codes is one of S successive Polar codes selected from the Polar code having the length of N, data except the starting point of each group of the S groups of Polar codes are data obtained via extraction from the Polar code having the length of N with S being a unit step length, and a length of each group of the S groups of Polar codes is N/S.

10. The terminal according to claim 9, wherein after dividing the Polar code having the length of N into the mutually exclusive S groups of Polar codes, each group of the S groups of Polar codes being data extracted from the Polar code having the length of N, the method further comprises: dividing each group of the S groups of Polar codes into M groups of Polar codes, wherein M is an integer power of 2; and performing the LLR calculation on each group of the S groups of Polar codes comprises: after performing an LLR calculation on each group of the M groups of Polar codes, performing, an LLR calculation on M LLR results obtained, and taking an LLR result of the M groups of Polar codes obtained as an LLR result of a respective group of the S groups of Polar codes.

11. The terminal according to claim 10, wherein dividing each group of the S groups of Polar codes into the M groups of Polar codes comprises:

dividing each group of the S groups of Polar codes having a length of N/S into the M groups of Polar codes, wherein a starting point of each group of the M groups of Polar codes is one of M successive Polar codes selected from each group of the S groups of Polar codes having the length of N/S, data except the starting point of each group of the M groups of Polar codes are data obtained via extraction from each group of the S groups of Polar codes having the length of N/S with M being a unit step length, and a length of each group of the M groups of Polar codes is N/(S*M).

12. The non-transitory computer readable storage medium according to claim 10, wherein performing the LLR calculation on each group of the M groups of Polar codes comprises:

performing, in parallel, the LLR calculation on each group of the M groups of Polar codes.

13. The terminal according to claim 9, wherein performing the LLR calculation on each group of the S groups of Polar codes comprises:

performing, in parallel, the LLR calculation on each group of the S groups of Polar codes.

14. The non-transitory computer readable storage medium according to claim 7, wherein dividing the Polar code having the length of N into the mutually exclusive S groups of Polar codes, each group of the S groups of Polar codes being data extracted from the Polar code having the length of N, comprises:

dividing the Polar code having the length of N into the mutually exclusive S groups of Polar codes, wherein a starting point of each group of the S groups of Polar codes is one of S successive Polar codes selected from the Polar code having the length of N, data except the starting point of each group of the S groups of Polar codes are data obtained via extraction from the Polar code having the length of N with S being a unit step length, and a length of each group of the S groups of Polar codes is N/S.

15. The non-transitory computer readable storage medium according to claim 14, wherein after dividing the Polar code having the length of N into the mutually exclusive S groups of Polar codes, each group of the S groups of Polar codes being data extracted from the Polar code having the length of N, the method further comprises:

dividing each group of the S groups of Polar codes into M groups of Polar codes, wherein M is an integer power of 2; and performing the LLR calculation on each group of the S groups of Polar codes comprises: after performing an LLR calculation on each group of the M groups of Polar codes, performing an LLR calculation on M LLR results obtained, and taking an LLR result of the M groups of Polar codes obtained as an LLR result of a respective group of the S groups of Polar codes.

16. The non-transitory computer readable storage medium according to claim 15, wherein dividing each group of the S groups of Polar codes into the M groups of Polar codes comprises:

dividing each group of the S groups of Polar codes having a length of N/S into the M groups of Polar codes, wherein a starting point of each group of the M groups of Polar codes is one of M successive Polar codes selected from each group of the S groups of Polar codes having the length of N/S, data except the starting point of each group of the M groups of Polar codes are data obtained via extraction from each group of the S groups of Polar codes having the length of N/S with M being a unit step length, and a length of each group of the M groups of Polar codes is N/(S*M).

17. The non-transitory computer readable storage medium according to claim 15, wherein performing the LLR calculation on each group of the M groups of Polar codes comprises: performing, in parallel, the LLR calculation on each group of the M groups of Polar codes.

18. The non-transitory computer readable storage medium according to claim 14, wherein performing the LLR calculation on each group of the S groups of Polar codes comprises:
  performing, in parallel, the LLR calculation on each group of the S groups of Polar codes.

* * * * *